(12) United States Patent
Adams

(10) Patent No.: US 8,578,620 B1
(45) Date of Patent: Nov. 12, 2013

(54) MEASUREMENT DEVICE FOR MEASURING ALIGNMENT OF SCREEN PRINTED IMAGES

(76) Inventor: Randy L. Adams, Mt. Juliet, TN (US)

( * ) Notice: Subject to any disclaimer, the term of this patent is extended or adjusted under 35 U.S.C. 154(b) by 204 days.

(21) Appl. No.: 13/181,977

(22) Filed: Jul. 13, 2011

(51) Int. Cl.
*G01B 5/02* (2006.01)
*G01B 5/14* (2006.01)
*G03F 9/00* (2006.01)

(52) U.S. Cl.
USPC ............. 33/614; 33/796; 33/802; 33/806; 33/811

(58) Field of Classification Search
USPC .......... 33/620, 614, 617, 619, 621, 623, 783, 33/784, 792, 793, 794, 795, 796, 802, 803, 33/804, 806, 810, 811, 813, 814
See application file for complete search history.

(56) References Cited

U.S. PATENT DOCUMENTS

| 143,904 | A | * | 10/1873 | Hilgenreiner | 33/620 |
|---|---|---|---|---|---|
| 1,377,511 | A | * | 5/1921 | Novotny | 33/621 |
| 3,513,775 | A | | 5/1970 | Guthrie | |
| 4,091,726 | A | | 5/1978 | Walker | |
| 4,493,254 | A | | 1/1985 | Landesman et al. | |
| 4,700,488 | A | * | 10/1987 | Curti | 33/613 |
| 5,129,155 | A | * | 7/1992 | Hoffman et al. | 33/614 |
| 5,193,457 | A | * | 3/1993 | Hahn et al. | 101/129 |
| 5,255,052 | A | * | 10/1993 | Ternes et al. | 355/91 |
| 5,255,607 | A | * | 10/1993 | Nishiyama et al. | 101/463.1 |
| 5,390,427 | A | * | 2/1995 | Heller et al. | 33/811 |
| 5,570,513 | A | * | 11/1996 | Peterson | 33/506 |
| 5,613,436 | A | | 3/1997 | Taylor | |
| 5,664,495 | A | | 9/1997 | Winter | |
| 5,718,057 | A | | 2/1998 | Rosli et al. | |
| 5,953,987 | A | | 9/1999 | Oleson | |
| 6,038,977 | A | | 3/2000 | Haney et al. | |
| 6,101,938 | A | | 8/2000 | Adams | |
| 6,247,244 | B1 | * | 6/2001 | Zanier et al. | 33/819 |
| 6,691,616 | B2 | | 2/2004 | Wolf | |
| 7,043,852 | B2 | * | 5/2006 | Hayashida et al. | 33/813 |
| 2001/0052191 | A1 | * | 12/2001 | Fujikawa | 33/813 |

* cited by examiner

*Primary Examiner* — Christopher Fulton
(74) *Attorney, Agent, or Firm* — Egbert Law Offices, PLLC

(57) ABSTRACT

A measurement apparatus for measuring alignment of screen printed images has a body with a top surface and a bottom surface and an opening extending between the top surface and the bottom surface, and a measuring device for measuring an offset between the screen printed images. The measuring device is positioned adjacent the opening at the bottom of the body. An adjusting mechanism is cooperative with the measuring device for selectively adjusting the measuring device. A gauge is positioned on the body and cooperative with the adjusting mechanism so as to provide a positive numerical indication of the offset between the screen printed images.

14 Claims, 1 Drawing Sheet

MEASUREMENT DEVICE FOR MEASURING ALIGNMENT OF SCREEN PRINTED IMAGES

CROSS-REFERENCE TO RELATED U.S. APPLICATIONS

Not applicable.

STATEMENT REGARDING FEDERALLY SPONSORED RESEARCH OR DEVELOPMENT

Not applicable.

NAMES OF PARTIES TO A JOINT RESEARCH AGREEMENT

Not applicable.

REFERENCE TO AN APPENDIX SUBMITTED ON COMPACT DISC

Not applicable.

BACKGROUND OF THE INVENTION

1. Field of the Invention

The present invention relates to silk screening printing. More particularly, the present invention relates to devices for properly measuring and aligning screen printed images. Additionally, the present invention relates to measurement device that can indicate an offset relationship between screen printed images.

2. Description of Related Art

Including Information Disclosed Under 37 CFR 1.97 and 37 CFR 1.98.

Indicia applied permanently to articles of clothing and other textiles have become very popular. Fanciful indicia, such as logos, slogans, college names, sports team names and sayings, are now commonplace. As a result, screen printing has become very popular. Large commercial operations that screen print textiles are common today.

Indicia can be one or more colors. Typically, a screen printing machine has at least one station for each color employed. For example, a design incorporating two colors will have at least two printing stations, one for each color. A design employing eight colors will have at least eight stations. Each station generally includes a printing head, which supports a single screen, the ink to be used at that station and a mechanism for applying the ink to the textile. Each color is carried by a single screen. The textile to be screened travels from printing station to printing station by one of a number of methods, such as a chain or a rigid arm. The textile is usually carried by a metal pallet, pallet support, flat bed, or platen. Common printing machines include turret, oval and linear. In addition to printing stations, there are may also be curing stations to heat and set the inks placed on the textile or substrate. Because of the intricacies and the numerous colors involved in more recent designs, registration and indexing of the textiles from station-to-station have become crucial requiring exacting tolerances. Accordingly, attention is mandatory to these aspects of the screen printing process. Registration and complete accuracy are further demanded in the process leading up to printing the final product.

It is necessary to preposition, or align the screens before printing, so that, when each screen sequentially prints its portion of the composite print graphic, the images are in the approximate exact positions to accurately reproduce and reflect the original artwork. This process of prepositioning or aligning multiple screens is called "registering", and before any production run utilizing multiple screens can begin, all of the screens must be "registered" to ensure the proper fit of colors. Some designs may require colors to be separated by a required distance, while others may require colors to be aligned edge-to-edge with no separations. If accurate registration is not accomplished, colors may overlap and "bleed" into one another, or alternatively, be separated when they should be touching. Prints that are "out of register" may be blurry, inaccurate and generally inconsistent with the original artwork.

Since all of the screens have to be placed in the printing machine and in the proper place in relation to the other colors, the screens are placed in the printing machine as close to alignment as possible either by eye or using a device similar to an early invention by the present inventor (identified in U.S. Pat. No. 6,101,938). After the first test print, if the color are not in correct alignment, it is necessary to measure how far the color is off-location or "not in registration". As such, the user of the printing machine will move the screen over a small amount and test print again and measure again. This trial-and-error process is very time consuming and often results in inaccurate positioning. As such, a need has developed in which to provide a measurement device so that the operator of the screen printing machine can properly align the various colors as close as possible on the machine.

In the past, various patents have issued relating to screen printing machines and registration processes. For example, U.S. Pat. No. 6,101,938, issued on Aug. 15, 2000 to the present inventor, describes a system for accurately registering multiple silkscreens relative to a printing surface after they have been clamped into a silkscreen holder of a printing head of a rotary screen printing machine. A generally L-shaped registration device attached adjacent to one side of a pallet of the printing machine has first and second sides orthogonal relative to each other with a pair of gauges having visual displays positioned on the first side and a third gauge positioned on the second side. The gauges have outwardly-biased plungers controlled by a lever to be simultaneously moved between a retracted positioned, a free-floating position and an engaged position relative to respective first and second sides of a silkscreen frame. The gauge displays allow the operator to take numerical readings to determine if, and how much, a frame has shifted from a zero setting after being clamped in the frame holder. It also indicates which frame has shifted and allows one to quickly re-register a frame to its previous setting. The gauge also compensates for frames having misaligned images.

U.S. Pat. No. 3,513,775, issued on May 26, 1970 to L. D. Guthrie, describes a process for registration and silk screening both sides of a sheet. Registrations bars are accurately located relative to the printing surface and the silk screen equipment. The sheet material to be printed remains attached at one edge thereof to a registration bar for printing first on one side and then on the other. The material is progressively laid on the printing surface by gradually withdrawing a support from the underside of the material.

U.S. Pat. No. 4,091,726, issued on May 30, 1978 to H. R. Walker, shows a magnetic registration apparatus for a silk screen printer. This apparatus includes a carriage for rotatably supporting the articles with respect to the longitudinal axis thereof and magnetic means on the carriage for drawing a magnetically attractable index on the article. As such, a surface on the article is oriented in a predetermined disposition with a pattern in the silk screen stencil. The carriage is adapted to lift the articles from a high speed conveyor into contact with the silk screen stencil.

U.S. Pat. No. 4,493,254, issued on Jan. 15, 1985 to Landesman et al., teaches a silk screen printing machine and drive system. This screen printing machine has a carousel rotatable about a central support and carries a circular arrangement of work-receiving tables. A rotation of the carousel causes the work-receiving tables to come into registry with corresponding printing units for screen printing of work carried by the work-receiving tables.

U.S. Pat. No. 5,613,436, issued on Mar. 25, 1997 to Taylor, describes a variable position pin registration plate for multi-color silk screen printing. The plate assembly includes an apparel support platen mounted on an elongated support arm and at least one pivoting silk screen frame support assembly movably supporting a silk screen frame above the apparel support platen. The registration plate assembly comprises a flat plate portion having a plurality of pairs of spaced vertical bores therethrough and a pair of pins each extending upwardly from the plate portion through one of the bores and adjustably secured in the bore. The pair of pins fit into correspondingly spaced holes in the rear side of the silk screen frame to provide final alignment of the frame on the apparel support platen as the frame is lowered into position.

U.S. Pat. No. 5,664,495, issued on Sep. 9, 1997 to R. B. Winter, shows a print screen alignment system for registering printing screens. This system includes a plurality of outwardly projecting electrical switches. The switches are positioned to engage a first side of a screen frame and positioned to engage a second side of the screen frame. The first and second sides of the frame are orthogonal relative to each other. A pair of lights are activated by engagement of the frame with the switches. Both of the lights being activated by simultaneous engagement of each of the switches by a screen frame. Similar sets of switches are provided on a table that supports the screens during exposure to an image to be replicated during printing and on a device that temporarily replaces a printing platen for alignment of each screen in a multi screen printing device.

U.S. Pat. No. 5,718,057, issued on Feb. 17, 1998 to Rosli et al., provides a register draw-in device for sheet printing and embossing machines. This device has two front or leading edge stops and a side stop. Position sensors detect print marks of a sheet. Two detectors associated with the front stops detect the sheet leading edge. The front stops are adjustable by control elements until front print marks on the sheet are detected by sensors. A control element then adjusts the side stop until a side print mark is detected by another sensor. A system control controls this register correction with the position sensors, the detectors and the control elements U.S. Pat. No. 5,953,987, issued on Sep. 21, 1999 to A. L. Oleson, provides a screen printing registration system. This system has an exposure frame and a registration printing pallet for registering a printing screen frame holding a screen first to the artwork and next to the pallet support the product to be screened.

U.S. Pat. No. 6,691,616, issued on Feb. 17, 2004 to T. Wolf, describes a device for detecting the position of a printing plate on a cylinder of a rotary printing machine. This device has register equipment corresponding with an edge of the printing plate. There is at least one mechanical stress sensor assigned to the register equipment. The mechanical stress sensor is a piezoelectric force sensor.

U.S. Pat. No. 6,038,977, issued on Mar. 21, 2000 to Haney et al., provides a multiple printing process registration method. A first image is printed a substrate at a first location different from a location of the digital printer. A template is mounted on the digital printer. The digital printer is used to print a second image on the template. The substrate is placed on the digital printer with respect to template. The first image on the substrate is aligned with the second image on the template. The substrate is secured on the digital printer at a location where the first image on the substrate aligns with the second image on the template. The digital printer can then be used to print the second image on the substrate in alignment with the first image.

It is an object of the present invention to provide a measuring device so as to allow the operator of a screen printing machine to properly align images.

It is another object of the present invention to provide a measurement device that allows accurate measurement to be taken of any offset or undesired misalignment of one color image with respect to another color image.

It is another object of the present invention to provide a measurement device that provides a numerical indicia relative to an offset relationship between the screen printed images.

It is still a further object of the present invention to provide a measurement device that facilitates the accurate printing of multi-color silk screen images.

It is still a further object of the present invention to provide a measurement device that minimizes the labor requirements and trial-and-error efforts in order to achieve a proper silk screened printed image.

These and other objects and advantages of the present invention will become apparent from a reading of the attached specification and appended claims.

BRIEF SUMMARY OF THE INVENTION

The present invention is a measurement device for measuring alignment of silk screen printed images. This measurement device includes a body having a viewer formed therethrough. A measuring means is provided on the body so as to provide a measurement of offset between screen printed images. An adjustment mechanism is connected to the measuring means for selectively adjusting the measuring means. A gauge is positioned on the body so as to be responsive to movement of the adjustment means and to provide a positive numerical indication of the offset relation between the screen printed images.

The body of the present invention has a top surface and a bottom surface. There is an opening through the body so as to allow the user of the measurement device to see through the body between the top surface and the bottom surface. Supports are provided at the bottom of the body so as to allow the body to be placed stably on an underlying surface. These supports are located at opposite ends of the bottom surface of the body.

The viewer is positioned on the top surface of the body. The viewer allows the user of the measurement device to see through the body and through an opening of the bottom of the body. A magnifying lens is positioned on the top surface of the body so as to magnify the image at the opening at the bottom of the body. The viewer is positioned adjacent to one end of the body.

A light can be supported within the body. The light serves to direct light outwardly of the opening at the bottom of the body. This light is positioned below the viewer. The light is offset of the line-of-sight from the viewer to the opening of the bottom of the body. The light, in the preferred embodiment, is a light-emitting diode.

The measuring means is located adjacent to the opening of bottom of the body. In particular, the measuring means comprises a first tang and a second tang so as to operate as a pair of measurement tangs. The first tang has a flat edge that will appear at the opening of bottom of the body. The first tang can be fixed to the bottom of the body. The second tang is movably support at the bottom of the body at the opening of bottom of the body. The second tang has a flat edge that faces the flat edge of the first tang. The first and second tangs are movable in relationship to each other so that, by adjustment, the measurement tangs will align with the images of the screen printed images so as to properly measure a misalignment or offset between such screen printed images.

The adjustment means includes an adjustment knob extending outwardly of an opposite end of the body. This adjustment knob serve to move the first and second tangs selectively with respect to each other such that the flat edges of the measuring tangs are movable in parallel relationship to each other. The adjustment knob is operably connected to the measuring tangs.

A gauge is mounted on the top surface so the body and is operatively connected with the adjustment knob. The gauge is indicative of the distance between the edges of the first and second tangs. The gauge can be either an analog measurement device or a digital measurement device. The gauge is responsive to movement of the adjustment knob. As such, the gauge provides a positive numerical indication of the amount of distance between the flat edges of the measuring tangs and also is indicative of the offset or misaligned position of one screen printed image with respect to another screen printed image.

In use, when a measurement is taken as to the amount of off-location color of one image with respect to another image, the screen can be moved. The gauges of the screen printing machine can be suitably adjusted so as to achieve the necessary alignment of these images. As such, the present invention is able to avoid any sort of guesswork and trial-and-error techniques during the screen printing process.

DETAILED DESCRIPTION OF THE INVENTION

Figure 1:
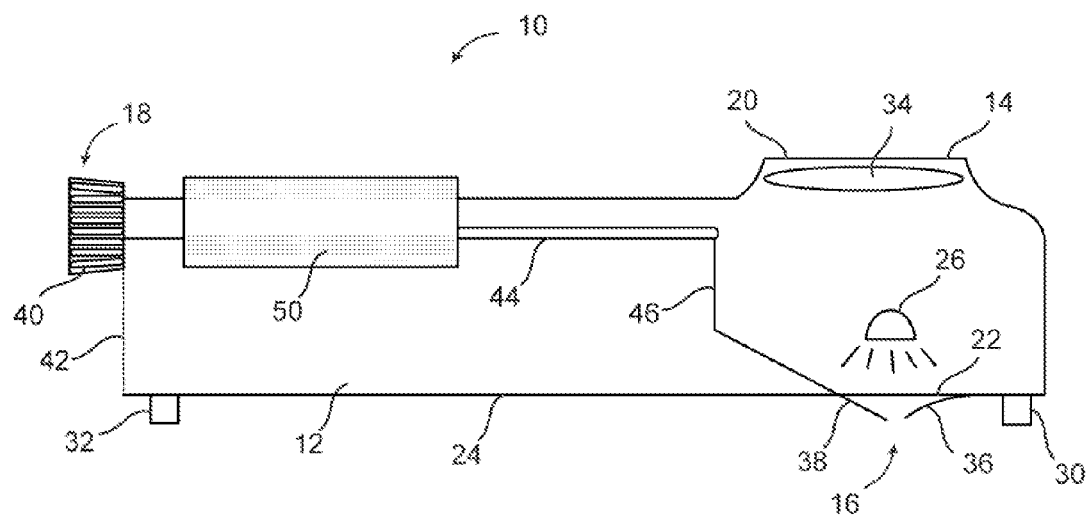
FIG. 1 is a side elevation view of the measurement device in accordance with the preferred embodiment of the present invention.

Referring to FIG. 1, there is shown the measurement device 10 for measuring alignment of screen printed images. The measurement device 10 includes a body 12 having a viewer 14, a measuring mechanism 16 and an adjustment mechanism 18. The viewer 14 is located on a top surface 20 of the body 12. There is an opening 22 at the bottom surface 24 of body 12. As such, a person looking through the viewer 14 at the top surface 20 of body 12 will be able to see through the body 12 and the opening 22 at the bottom surface 24. As such, the viewer 14 is able to see the measuring mechanism 16 at the opening 22. A light 26 is positioned within the body 12 so as to illuminate the area adjacent to the measuring mechanism 16.

In the present invention, the body 12 has supports 30 and 32 extending from the bottom surface 24. The supports 30 and 32 allow the body 12 to be placed stably on a underlying surface. As such, it is not necessary to hand-hold the measurement device 10 during the taking of measurements. The bottom surface 24 of the body 12 will be spaced a small distance above the underlying surface. The measuring mechanism 16 will reside in the space above the underlying surface.

The viewer 14 includes a magnifying lens 34 positioned at the top surface 20 of body 12. The magnifying lens 34 allows the image associated with the measuring mechanism 16 to be appropriately magnified for viewing by the user of the device 10.

The measuring mechanism 16 includes a first tang 36 and a second tang 38. The first tang 36 and the second tang 38 are movable relative to each other. The first tang 36 and the second tang 38 are located at the opening 22 at the bottom surface 24 of body 12. It an be seen that the first tang 36 is in a fixed position relative to the bottom surface 24. The second tang 38 is movable in relation to the first tang 36 through the use of the adjustment mechanism 18. The space between the end edges of the tangs 36 and 38 can be clearly seen and magnified through the magnifying lens 34 of the viewer 14.

The adjustment mechanism 18 has a knob 40 extending outwardly of an end 42 of body 12. The adjustment knob 40 is suitably connected by a shaft 44 and an arm 46 to the second tang 38. The rotation of the adjustment knob 40 will cause the shaft 44 to suitably rotate so as to draw the arm 46 inwardly or outwardly. This, in turn, causes the end edge of the second tang 38 to move toward the first tang 36 or away from the first tang 36. The shaft 44 and the arm 46 extend through the interior of the body 12.

A gauge 50 is positioned on the top surface 20 of the body 12. The gauge 50 is suitably interconnected to the adjustment mechanism 18 so as to produce a visual indication of the movement of the adjustment knob 40. In other words, the indication shown on the gauge 50 will be indicative of the space between the end edges of the tangs 36 and 38.

Figure 2:
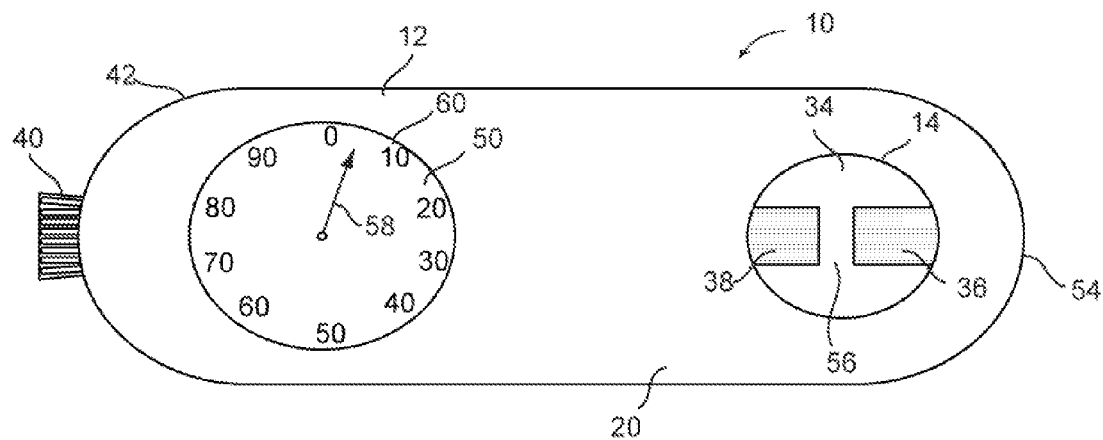
FIG. 2 is a top view of the measurement device in accordance with the preferred embodiment of the present invention.

FIG. 2 is a top view of the measurement device 10. In particular, the body 12 of the measurement device 10 has a top surface 20. The viewer 14 is illustrated as located adjacent to one end 54 of the body 12. The adjustment knob 40 is located at the opposite end 42 of the body 12.

In FIG. 2, it can be seen that the tangs 36 and 38 can be easily viewed through the magnifying lens 34 of the viewer 14. Each of the tangs 36 and 38 is shown as having a flat end edge facing each other. There is a space 56 between the end edges of the tangs 36 and 38.

By proper manipulation of the adjustment knob 40, the space 56 can be increased or decreased. The end edges of the tangs 36 and 38 can be placed adjacent to the edges of the respective screen printed images. As such, the space 56 will be indicative of a misalignment or offset between the screen printed images.

The gauge 50 is also positioned on the top surface 20 of the body 12. The gauge 50, in the preferred embodiment, is an analog device with an arrow 58. There are indica 60 that extend around the periphery of the gauge 50. The indicia 60 are in the form of numerals that are representative of the amount of space 56. The arrow 58 will move relative to the movement of the adjustment knob 40. As such, the arrow 58 will point to a numerical representation of the space 56. This provides the operator with a numerical representation of the amount of offset or misalignment between the screen printed images. The numerical indicia pointed by arrow 58 can then be entered into the screen printing machine so as to achieve an accurate alignment of the images.

The foregoing disclosure and description of the invention is illustrative and explanatory thereof. Various changes in the details of the illustrated construction can be made within the scope of the appended claims without departing from the true spirit of the invention. The present invention should only be limited by the following claims and their legal equivalents.

I claim:

1. A measurement apparatus for measuring alignment of screen printed images, the measurement apparatus comprising:
   a body having a top surface and a bottom surface, said body having an opening extending between said top surface and said bottom surface;
   a first tang positioned at said bottom surface of said body and viewable through said opening; and
   a second tang positioned at said bottom surface and viewable through said opening, said first tang being fixed to said bottom surface and extending angularly inwardly so as to have an edge exposed through said opening, said second tang being adjustably movable relative to said first tang, said second tang extending angularly toward said first tang so as to have an edge exposed through said opening in adjustable spaced relationship to said edge of said first tang, said first and second tangs suitable for measuring an offset between the screen printed images.

2. The measurement apparatus of claim 1, further comprising:
   an adjusting means cooperative with said second tang for selectively moving said edge of said second tang in relation to said first tang.

3. The measurement apparatus of claim 2, further comprising:
   a gauge positioned on said body and cooperative with said adjusting means so as to provide a positive numerical indication of the offset between the screen printed images.

4. The measurement apparatus of claim 1, further comprising:
   a viewer positioned over said opening at said top surface of said body.

5. The measurement apparatus of claim 4, said viewer being a magnifying lens positioned adjacent one end of said body.

6. The measurement apparatus of claim 1, further comprising:
   a light supported by said body in or adjacent to said opening so as to direct light outwardly of said opening at said bottom surface of said body.

7. The measurement apparatus of claim 6, said light being offset from a line-of-sight through said opening of said body towards said measuring means.

8. A measurement apparatus for measuring alignment of screen printed images, the measurement apparatus comprising:
   a body having a top surface and a bottom surface, said body having an opening extending through said body between said top surface and said bottom surface, said body having a first support at one end of said body and a second support at an opposite of said body, said first and second supports for supporting said bottom surface of said body a distance above an underlying surface, each of said first and second supports having a bottom positioned in a common plane;
   a first tang positioned at said bottom surface and having an edge viewable through said opening; and
   a second tang positioned at said bottom surface of said body and having an edge viewable through said opening, said first and second tangs being adjustably movable with respect to each other, the edges of said first and second tangs positioned between said bottom surface of said body and said common plane, the edges of said first and second tangs suitable for measuring an offset between the screen printed images.

9. The measurement apparatus of claim 8, said first tang having a fixed position, said second tang being adjustable relative to said first tang.

10. The measurement apparatus of claim 8, said edge of said first tang being a flat edge, said edge of said second tang being a flat edge facing said flat edge of said first tang.

11. The measurement apparatus of claim 8, further comprising:
    a knob extending outwardly of said body at one end of said body.

12. The measurement apparatus of claim 11, further comprising:
    a gauge positioned on said top surface of said body, said gauge being operatively connected to said knob.

13. A measurement apparatus for measuring alignment of screen printed images, the measurement apparatus comprising:
    a body having a top surface and a bottom surface, said body having an opening extending therethrough;
    a viewer positioned over said opening;
    a body having a top surface and a bottom surface;
    a first tang positioned at said bottom surface of said body, said first tang having an edge fixedly and non-translatably positioned generally centrally of said opening below said viewer; and
    a second tang positioned at said bottom surface of said body, said second tang having an edge positioned below said view and being adjustably movable relative to said edge of said first tang, the edges of said first and second tangs suitable for measuring an offset between the screen printed images.

14. The measurement apparatus of claim 13, further comprising:
    a gauge positioned on said body and cooperative with said second tag so as to provide a positive numerical indication of the offset between the screen printed images.

* * * * *